United States Patent [19]

Allan et al.

[11] Patent Number: 5,416,743

[45] Date of Patent: May 16, 1995

[54] DATABUS ARCHITECTURE FOR ACCELERATED COLUMN ACCESS IN RAM

[75] Inventors: Graham Allan, Stittsville; Francis LaRochelle, Hull, both of Canada

[73] Assignee: Mosaid Technologies Incorporated, Kanata, Canada

[21] Appl. No.: 164,703

[22] Filed: Dec. 10, 1993

[51] Int. Cl.$^6$ ............................................... G11C 7/00
[52] U.S. Cl. ................... 365/203; 365/189.01; 365/205; 365/149; 365/190
[58] Field of Search ............ 365/203, 204, 205, 207, 365/208, 190, 189.01, 149

[56] References Cited

U.S. PATENT DOCUMENTS 5,193,075  3/1993  Hatano ........................ 365/190 X
5,251,175  10/1993  Taguchi ........................... 365/208
5,293,563  3/1994  Ohta ................................ 365/190

*Primary Examiner*—Eugene R. LaRoche
*Assistant Examiner*—Son Mai
*Attorney, Agent, or Firm*—Pascal & Associates

[57] ABSTRACT

The present invention relates to a method of writing or reading a semiconductor random access memory (DRAM or SRAM) having plural sense amplifiers connected to lines and having data bus read and write amplifiers, comprised of providing a pair of data buses for access by each sense amplifier and each read and write amplifier, reading or writing one data bus while precharging the other data bus during a first read or write cycle, and reading or writing the other data bus while precharging the first data bus in a second read or write cycle following the first read or write cycle.

11 Claims, 4 Drawing Sheets

DATABUS ARCHITECTURE FOR ACCELERATED COLUMN ACCESS IN RAM

FIELD OF THE INVENTION

This invention relates to semiconductor memories, and in particular to a method and apparatus for accelerated column access in dynamic random access memories (DRAMs) and static random access memories (SRAMs).

BACKGROUND TO THE INVENTION

The description below relates to DRAMs, although the invention can be applied equally well to SRAMs, and should be construed as such.

DRAMs are typically formed of orthogonally disposed word lines and bit lines, with charge storage cells adjacent each intersection addressed via the wordlines and connected to the bit lines. Each charge storage cell stores a charge received from a bit line when it is addressed, that designates the value (0 or 1) of a bit. Bit lines are typically in a well known folded form, formed of two conductors, that interface a data bus via a sense amplifier and column access devices, such as field effect switches that are addressed via a column decoder.

Pertinent circuitry of a typical prior art DRAM is illustrated in FIG. 1. A charge storage cell is formed of a capacitor 1 connected in series with a field effect transistor 2 (FET) between a voltage supply Vcp and a conductor of a folded bitline 3. The gate of the FET is connected to a wordline 4. The bitline is connected to a sense amplifier 5. Each output conductor of the sense amplifier is connected through an FET 6 to a corresponding conductor of a data bus 8. The gates of FETs 6 are connected together to the output of a column decoder, which provides the control signal Yi, which is a decoded column address signal to those gates.

The conductors of data bus 8 are connected differentially to the input of a read amplifier 9, and to the output of a write amplifier 10. A source of precharge voltage Vcc/2 is connected through FETs 11 to corresponding conductors of the data bus 8. The conductors of data bus 8 are connected together through FET 12. The gates of transistors 11 and 12 are connected together and to a source of a precharge enable control signal, PRE. A write enable signal WMA is provided to a control input of the write amplifier, and a read enable signal RMA is provided to a control input of the read amplifier.

In operation, with reference to the signal waveforms illustrated in FIG. 2A, a precharge enable signal PRE is applied to FETs 11 and 12, causing the data bus to be precharged to Vcc/2. As shown by the waveform PRE, the precharge enable pulse goes to low logic level, and during that interval the decoded column address signal Yi is applied to FETs 6. As a result charge stored on the bitlines resulting from sensing by the sense amplifier of charge stored in a storage cell 1 passes through FETs 6 and is applied differentially to the conductors of data bus 8. The resulting voltage on the data bus conductors is shown in waveform diagram DB/DB,, which is in sawtooth form resulting from the capacitance of the data bus charging in a less than ideal manner, i.e. taking significant time to charge.

After a predetermined time, reading by the read amplifier 9 is enabled, with the application of a read pulse, as shown in waveform Enable RMA, which lasts over an interval terminating prior to the onset of the next cycle, when the data bus voltage decreases, and the next precharge begins.

With reference to FIG. 2B, a write cycle occurs with the inhibiting of the transistors 11 and 12, Precharge PRE being at low logic level. During that interval, write amplifier 10 is enabled by the Enable WMA control signal, which causes full logic level voltage to be applied differentially to the data bus 8. The data bus voltage rises faster than in the earlier case, due to the larger drive capability of the write amplifier as shown by waveform DB/DB*. After a predetermined rise time and time for the voltage on the data bus to become stable, a decoded column address signal Yi is applied to transistors 6, which causes the logic level to be sensed and passed to those charge storage cells that have been addressed via a corresponding wordline.

It has been an objective to raise the speed of operation of DRAMs to accommodate burst rates at least as high as 100 MHz and also to increase the speed of SRAMs. Normal data bus architectures such as the one described above cannot easily operate at 10 ns or less cycles because of the need to charge the capacitance associated with the long data bus conductors, as was seen by the rise times encountered by the signal DB/DB* in FIG. 2A.

In read operations the bitline sense amplifier, which is small, must charge and discharge the appropriate differential data bus lines to develop a large enough differential signal on the opposite end of the memory array that can be detected by the read amplifier. After the data bus is read, its conductors must be precharged in anticipation of the next read cycle.

In write operations, the data bus write amplifier must drive the data bus to full 0 and 1 logic levels to flip the bit line sense amplifier.

For either read or write operations there is not enough time to perform the necessary operations at 100 mHz. For reliability of operation adequate time margin between turning off precharge and turning on Y (column)-access (for example) must be provided.

A synchronous DRAM (SDRAM) has been defined in an effort to provide a structure that can operate at 100 MHz. An SDRAM is in essence a conventional DRAM with a synchronous interface to external circuitry. Synchronous DRAMs employing a clocked rather than a synchronous interface have been defined. SDRAMS are described in the article "Synchronous DRAMs: Designing to the JEDEC standard" in Micron Design Line, volume 2, issue 2, pages 1–5. The standard specifies that multiples of two clocks must occur from one random column-address to the next, which is referred to as the "2N Rule". An SDRAM normally operates in a burst mode, in which data from consecutive column addresses is accessed sequentially. The article states that there are two forms of SDRAM architecture, one referred to as having "prefetch" architecture and the other referred to as having "pipeline" architecture, both producing the same results. The pipeline architecture can issue column-addresses on consecutive clocks, whereas the prefetch architecture is restricted by the 2N rule.

Since the "2N Rule" must be adhered to, the column address can be changed only every second 10 ns clock period. The output data during the clock period following the data from a new address N must be from address N+1. A read cycle is employed which fetches twice as much data from the memory array as is actually required, saving half for output in the following period. In this way the internal data bus cycle rate is halved.

However, this design has a significant impediment since there is no ability to input column address randomly on each clock period.

SUMMARY OF THE INVENTION

The present invention provides the ability to column access at high speed burst rates, e.g. approaching or at 100 MHz, without the limitation of the "2N Rule". Further, a new random column address can be input every clock period. This results in a DRAM having significantly improved performance.

In accordance with an embodiment of the invention, a method of writing or reading a semiconductor random access memory (DRAM) having plural sense amplifiers connected to bit lines and having data bus read and write amplifiers, is comprised of providing a pair of data buses for access by each sense amplifier. Each data bus has its own read and write amplifier, reading or writing one data bus while precharging the other data bus during a first read or write cycle, and reading or writing the other data bus while precharging the first data bus in a second read or write cycle following the first read or write cycle.

In accordance with another embodiment, a semiconductor DRAM is comprised of plural sense amplifiers connected to bit lines, a pair of data buses, column address decoders for selectably connecting each sense amplifier to the data buses, read amplifiers connected to the data buses, apparatus for precharging one of the data buses during a first time period, apparatus for charging and reading the other of the data buses during the first time period, apparatus for precharging the other of the data buses during a second time period following the first time period, and apparatus for charging and reading the first of the data buses during the second time period.

Thus the number of data buses is doubled from the prior art architecture. Each column has a set of Y (column-access) transistors which can connect to either the odd or even databus.

A synchronous DRAM clock input is divided by two to create an odd/even data bus control signal. Any read or write cycle occuring during the odd or even time period is performed over the corresponding odd or even data bus. During this time the opposite respective even or odd data bus is precharged. In this way the precharge time is removed from the e.g. 10 ns. time budget for column access.

The even or odd data bus assignments are completely independent of memory addressing. Whether the odd or the even data bus is employed in any particular read or write operation depends entirely on the time the command is given and the state of the clock divider logic.

BRIEF INTRODUCTION TO THE DRAWING

A better understanding of the invention will be obtained with reference to the detailed description below, and to the following drawing, in which:

FIG. 1 is a schematic diagram of a column access portion of a semiconductor dynamic random access memory in accordance with the prior art, FIGS. 2A and 2B are diagrams of signals used during read and write cycles respectively of the prior art circuit of FIG. 1, FIG. 3 is a schematic diagram of a column access portion of a semiconductor dynamic random access memory in accordance with the present invention, FIGS. 4A and 4B are diagrams of signals used during read and write cycles respectively of the circuit of FIG. 3.

DETAILED DESCRIPTION OF THE INVENTION

Figure 1:
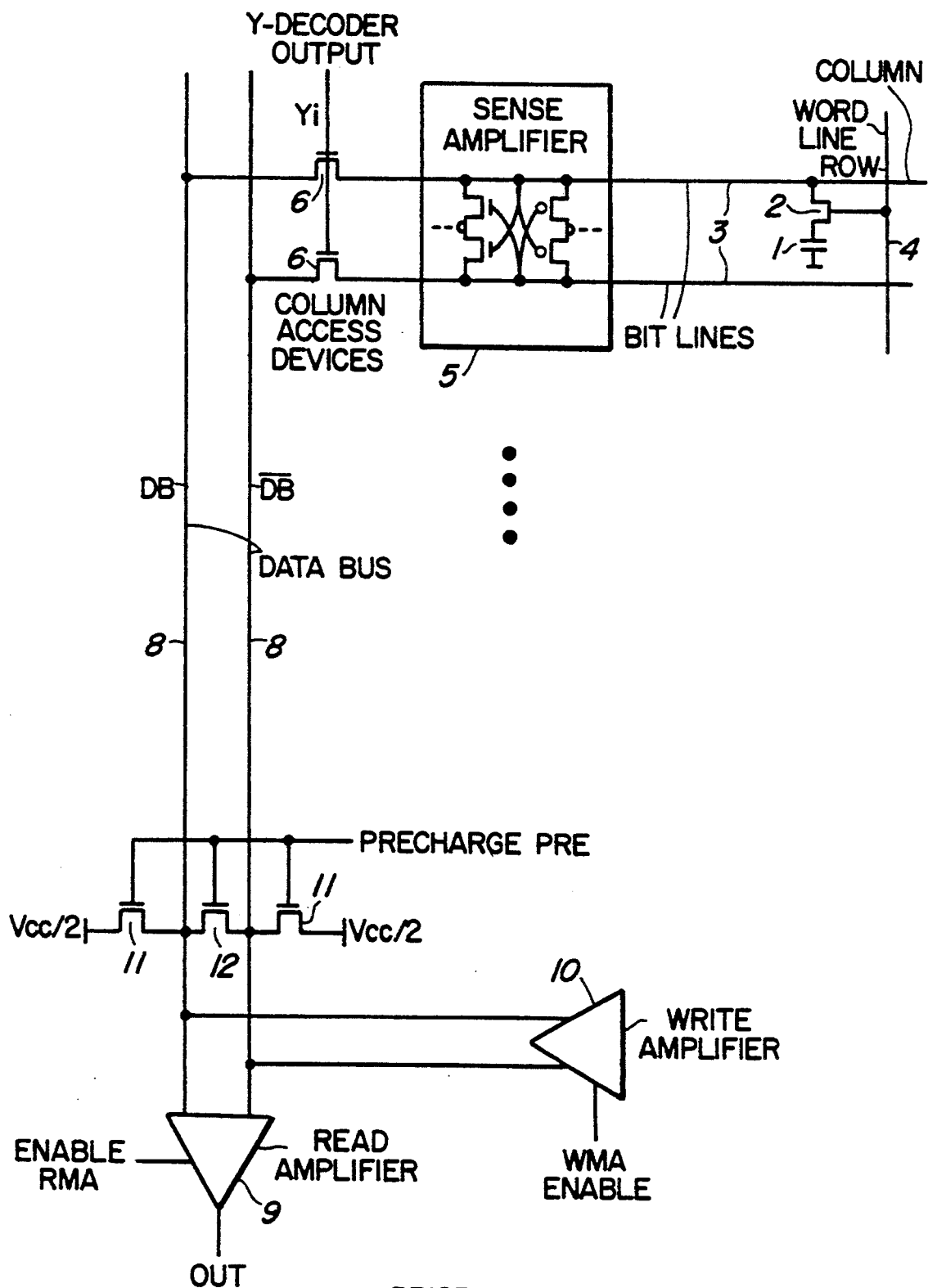
Figure 2A:
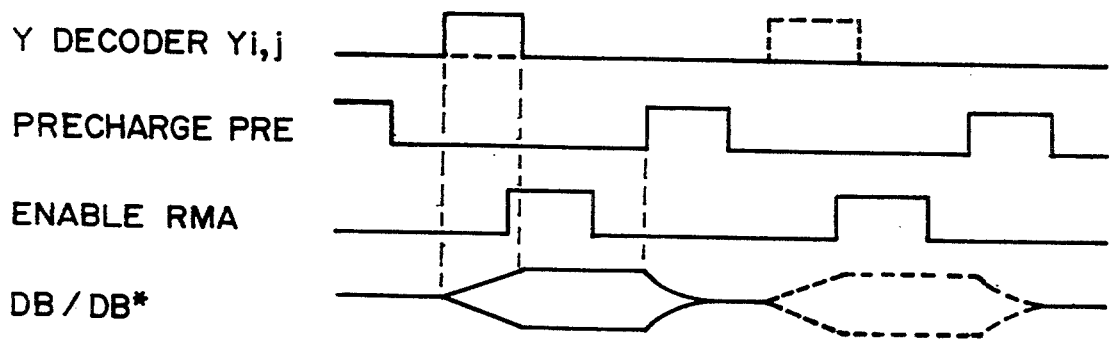
Figure 2B:
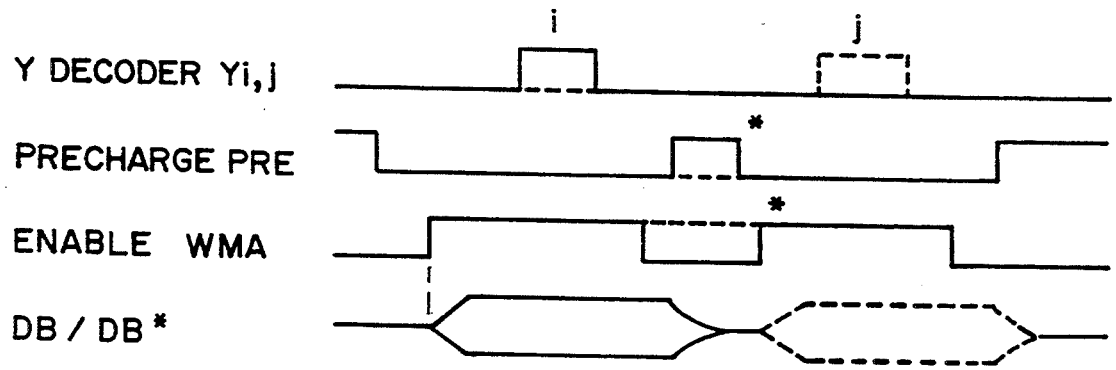
Figure 3:
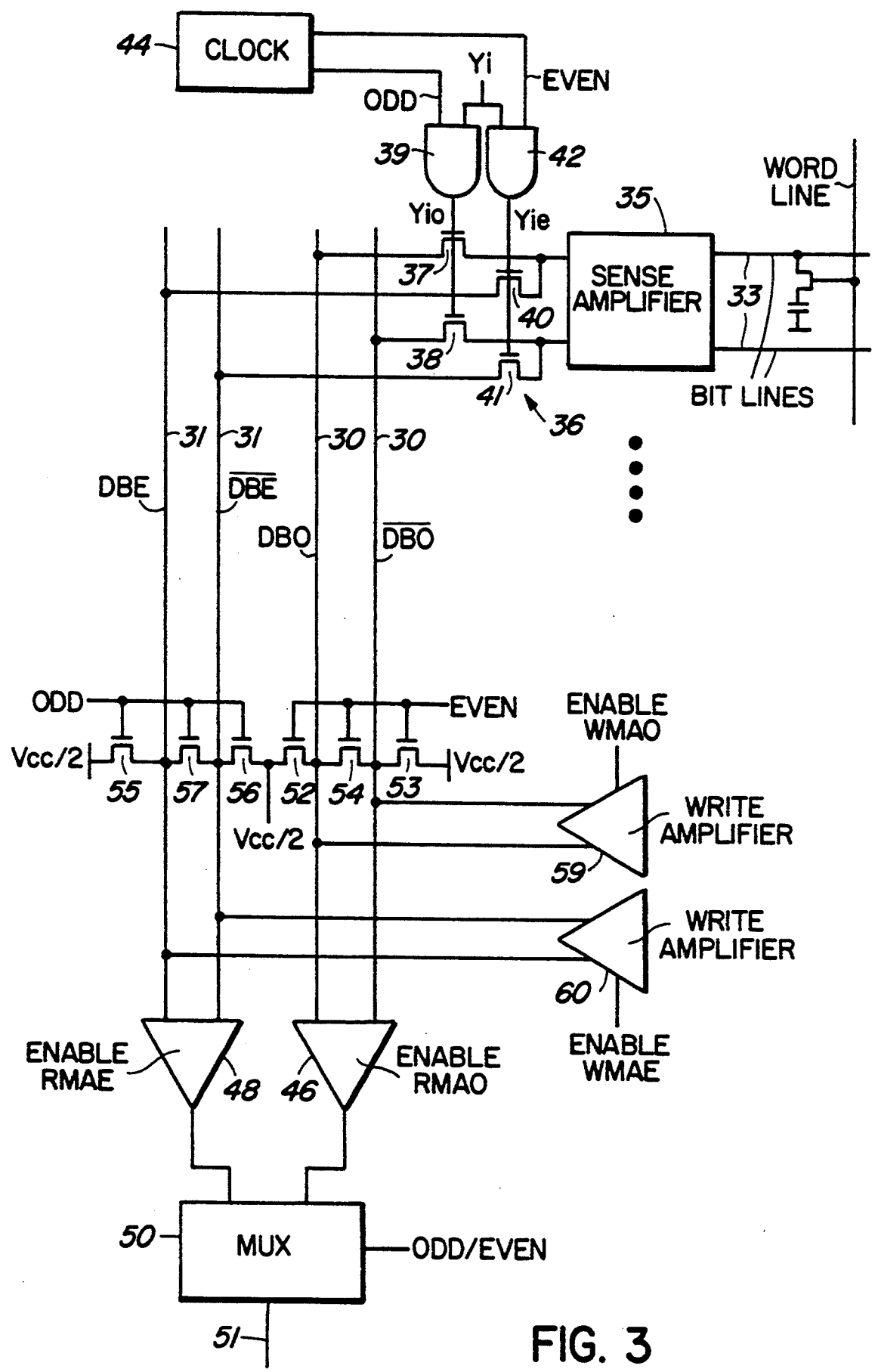

With reference to FIG. 3, a schematic diagram of a preferred embodiment of the invention is shown. A pair of data buses 30 and 31 are used, instead of a single data bus.

The memory is comprised of bit lines 33, such as well known folded bit lines, connected to sense amplifiers 35. Each sense amplifier has a pair of output conductors which, instead of being connected through column decoder semiconductor (FET) switches to corresponding conductors of a data bus as in the prior art, are connected through a column decoder 36 to corresponding conductors of both data buses 30 and 31. The column decoder can connect the sense amplifier alternately to each of the data buses 30 and 31, as will be described below.

The conductors of each sense amplifier are connected to corresponding conductors of data bus 30 through field effect transistors 37 and 38, which have their gates connected together and to the output of an AND gate 39. The conductors of each sense amplifier are also connected to corresponding conductors of data bus 31 through field effect transistors 40 and 41, which have their gates connected together and to the output of an AND gate 42. One of the inputs of each of AND gates 39 and 42 is connected to the output of a column decoder (not shown), which provides the signal column decode signal Yi. The other input of one of the gates 39 is connected to an ODD clock pulse output of a synchronous clock 44, and the other input of the other of the gates 42 is connected to an EVEN clock pulse output of a synchronous clock 44.

The ODD and EVEN clock pulse outputs are serial time periods that can be derived from a synchronous DRAM clock divided by two, to create ODD and EVEN control signals.

Read amplifiers 46 and 48 are respectively connected to corresponding data buses 30 and 31. An odd read enable signal RMAO is applied to a control input of read amplifier 46 and an even read enable signal RMAE is applied to a control input of read amplifier 48 (from a CPU, not shown), during intervals to be described further below.

A multiplexer 50 receives the output signals of the read amplifiers; the ODD and EVEN control signals derived from clock 44 are applied to a control input of the multiplexer 50, to control which read amplifier output signal is output from the multiplexer 50.

When enabled, field effect transistor switches 52 and 53 connect the respective conductors of data bus 30 to a source of precharge voltage Vcc/2, and field effect transistor switch 54 connects conductors 30 together. Similarly, when enabled, field effect transistor switches 55 and 56 connect the respective conductors of data bus 31 to a source of precharge voltage Vcc/2, and field effect transistor switch 57 connects conductors 30 together. The gates of transistors 52, 53 and 54 are connected together and to the source of the EVEN control signal, and the gates of transistors 55, 56 and 57 are connected together and to the source of the ODD control signal.

The output of write amplifier 59 is connected to data bus 30, and the output of write amplifier 60 is connected to data bus 31. An odd write enable signal WMAO is applied to a control input of write amplifier 59 and an even write enable signal WMAE is applied to a control input of write amplifier 60 (from a CPU, not shown), during intervals to be described further below.

Figure 4A:
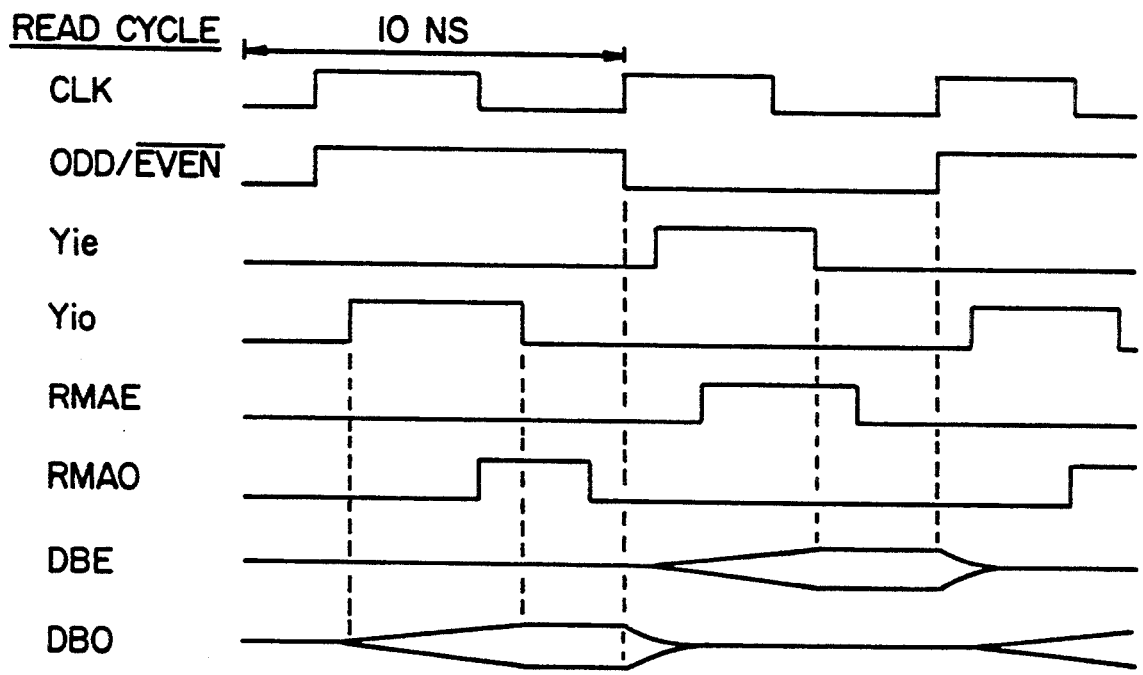

With reference to FIG. 4A, a timing diagram of the signals and elements described above, the circuit operates as follows.

A synchronous clock, which operates at e.g. 100 MHz, has clock cycles of e.g. 10 ns. as shown. After a division by two, ODD and EVEN control signals, each twice as long as each primary clock cycle, are produced, and are output from clock element 44.

During, for example, the ODD logical high interval, the ODD control signal is applied to AND gate 39, while the EVEN control signal is at low logic level. A column decode signal Yi is applied to the Yi inputs of gates 39 and 42, and the result is a logical high output signal Yio of gate 39.

At that instant, data bus 30 begins to charge from its previous charged level (which will have been precharged, as will be described below), and will continuously increase as its capacitance charges up, as shown by waveform DBO. At the end of the ODD logical high interval, the charge decreases on data bus 30, as shown by waveform DBO.

At a predetermined time, dependent on the expected time of charging of the data bus to a sufficient level, read amplifier 46 is enabled by signal RMAO, over the logical interval shown by signal RMAO in FIG. 4A, which extends to a time not exceeding the end of the ODD control signal logical high. With the ODD control signal applied to a control input of multiplexer 50, multiplexer 50 outputs the output signal from read amplifier 46 to bus output 51.

During the ODD logical high interval, transistor switches 55, 56 and 57 receive the ODD control signal on their gates, providing conductive paths, and thus both allowing precharge voltage to reach each conductor of data bus 31, and causing the voltages to be the same on each conductor of data bus 31, by connecting them together.

The ODD interval cyclically goes to low logic level following its high logical interval, producing the EVEN interval, as may be seen from FIG. 4A. AND gate 42 conducts, producing signal Yie at its output, and enabling transistors 40 and 41, whereas transistors 37 and 38 are now inhibited. The charge from sense amplifier 35 passes to data bus 31, charging it up from its precharge level Vcc/2, to which it was precharged during the ODD logical high interval, and causing the voltage on data bus 31 to rise as shown in signal waveform DBE.

At a predetermined time dependent on the expected charging time of the data bus, a read enable signal RMAE is applied to a control input of read amplifier 48, and with the EVEN control signal applied to multiplexer 50, the output signal on data bus 31 is passed through multiplexer 50 to the bus output 51.

During the EVEN interval, the EVEN control signal is applied to the gates of transistor switches 52, 53 and 54, which provide conductive paths and thus both allow precharge voltage to reach each conductor of data bus 30, and cause the voltages to be the same on each conductor of data bus 30, by connecting them together.

Figure 4B:
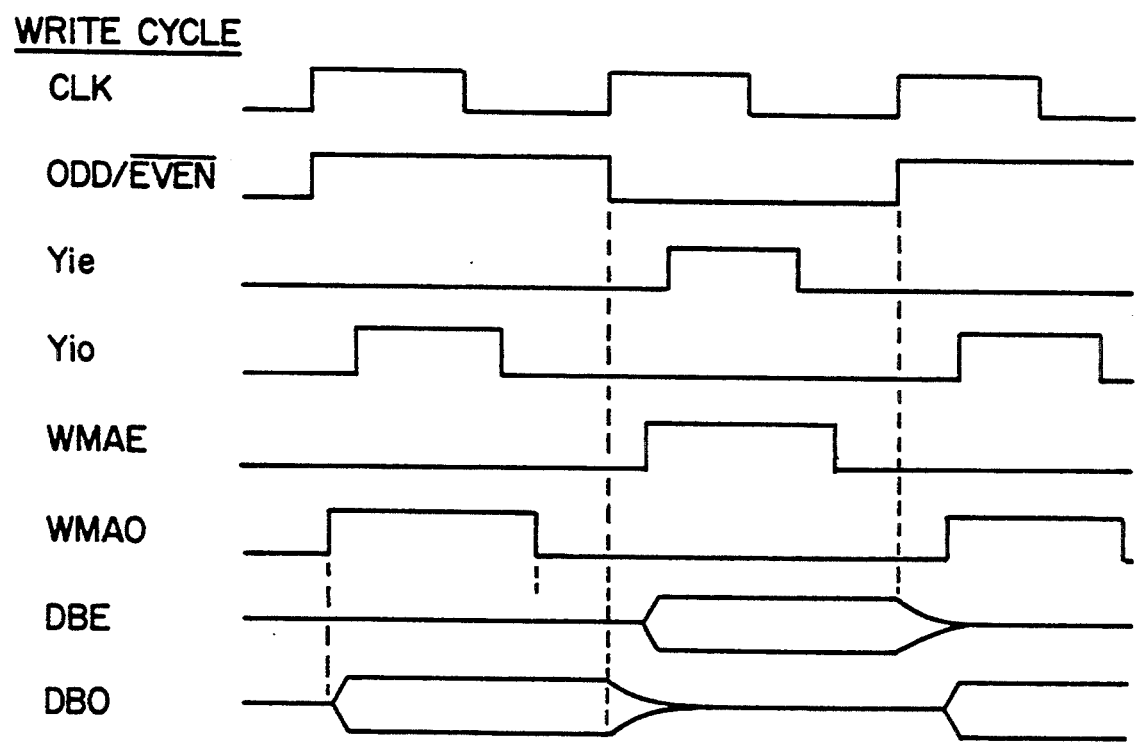

A write cycle will be described with reference to FIG. 4B instead of FIG. 4A. During an ODD interval, the control signal WMAO is received by write amplifier 59, which is enabled. The result is a rapid rise in the voltage of databus 30 to full logic level, as shown by waveform DBO. (It will be understood that this should be construed to mean that the differential voltage across the conductors of databus 30 is full logic level). At a time dependent on the expected rise time of the bus, transistors 37 and 38 are enabled by column decode signal Yi being received during the ODD interval. This enabling interval is shown as Yio. During that interval, the sense amplifier 35 becomes conductive, allowing the bit lines to charge to full logic level, and allowing each storage cell addressed via a word line to become charged, and thus store a bit.

During the following EVEN interval, the voltage on data bus 30 decreases as shown by waveform DBO. However the cycle as described above repeats for data bus 31, charged to full logic levels via write amplifier 60, and transferred via transistors 41 and 42 to charge bit lines 33 as well as any addressed storage cells connected thereto.

As noted above, it should be noted that the EVEN and ODD data bus assignments are completely independent of memory addressing. Thus whichever of the databuses is employed in any particular read or write operation depends entirely on the time the command is given and the state of the clock divider logic.

SDRAMS proposed previously employing a prefetch architecture must adhere to the "2N Rule", which states that the column address can be changed only every second (full, e.g. 10 ns.) clock period, and that the output data during the clock period following the data from a new address N must be from address N+1. That implementation employs a read cycle which fetches twice as much data from the memory array as is actually required, saving half for output in the following period. In that way the internal data bus cycle rate is halved.

On the other hand, the present invention, while doubling the number of data buses, achieves high speed but does not require the "2N Rule". A new random column address can be input every period, thus increasing both speed and flexibility.

A person understanding this invention may now conceive of alternative designs, using the principles described herein. All such designs which fall within the scope of the claims appended hereto are considered to be part of the present invention.

I claim:

1. A method of writing or reading a semiconductor random access memory (DRAM or SRAM) having plural sense amplifiers connected to bit lines and having data bus read and write amplifiers, comprising:
   a) providing a pair of data buses for access by each sense amplifier and each read and write amplifier,
   b) reading or writing one data bus while precharging the other data bus during a first read or write cycle, and
   c) reading or writing the other data bus while precharging the first data bus in a second read or write cycle following the first read or write cycle.

2. A method as defined in claim 1, in which the first and second cycles are consecutive odd and even time periods derived from a clock.

3. A method as defined in claim 2 including the step of inputting a column address each odd and even time period.

4. A semiconductor DRAM or SRAM comprising:
 a) of plural sense amplifiers connected to bit lines,
 b) a pair of data buses,
 c) column address decoders for selectably connecting each sense amplifier to the data buses,
 d) read amplifiers connected to the data buses,
 e) means for precharging one of the data buses during a first time period,
 f) means for charging and reading the other of the data buses during the first time period,
 g) means for precharging the other of the data buses during a second time period following the first time period, and
 h) means for charging and reading the first of the data buses during the second time period.

5. A memory a defined in claim 4 including a synchronous clock for providing said first and second time periods as alternating odd and even intervals.

6. A memory a defined in claim 5 in which the column address decoders are comprised of semiconductor switches driven from said clock for connecting each of a pair of leads from each sense amplifier to pairs of conductors of alternate data buses during alternate respective odd and even clock intervals, and in which the precharging means are comprised of semiconductor switches for connecting alternate pairs of conductors of the data buses to a source of precharge voltage during alternate respective even and odd clock intervals.

7. A memory as defined in claim 6 in which the reading means is comprised of a pair of read amplifiers each connected to a pair of conductors of a different data bus of said pair of data buses, a multiplexer for receiving separate outputs of each of the read amplifiers, and means for switching the multiplexer alternately between signals received from each of the read amplifiers in synchronism with said respective odd and even clock intervals.

8. A memory as defined in claim 6, further including writing means comprised of a pair of write amplifiers each having its outputs connected to one corresponding pair of conductors of one of said data buses, and means for enabling writing by each alternate write amplifier during alternate respective odd and even clock intervals.

9. A memory as defined in claim 6 in which the reading means is comprised of a pair of read amplifiers each connected to a pair of conductors of a different data bus of said pair of data buses, a multiplexer for receiving separate outputs of each of the read amplifiers, and means for switching the multiplexer alternately between signals received from each of the read amplifiers in synchronism with said respective odd and even clock intervals, and further including writing means comprised of a pair of write amplifiers each having its outputs connected to one corresponding pair of conductors of one of said data buses, and means for enabling writing by each alternate write amplifier during alternate respective odd and even clock intervals, and inhibiting enabling of any of the read amplifiers during intervals in which any of the write amplifiers associated with the pair of data buses is enabled.

10. A memory as defined in claim 9 including means for driving one data bus to full logic level during a clock interval prior to writing by one of the write amplifiers on said one data bus.

11. A memory as defined in claim 10 including means for addressing via a column address decoder during each of said time periods.

* * * * *